United States Patent
Greenwald et al.

(10) Patent No.: US 9,754,227 B2
(45) Date of Patent: Sep. 5, 2017

(54) SYSTEM AND METHOD FOR ADJUSTING THE EXERCISE SCHEDULE OF A GENERATOR

(75) Inventors: Eric Greenwald, Milwaukee, WI (US); Andrew John Sember, Plymouth, WI (US); Harrison C. Chiu, Grafton, WI (US); Jayson Pierringer, West Bend, WI (US)

(73) Assignee: Kohler Co., Kohler, WI (US)

( * ) Notice: Subject to any disclaimer, the term of this patent is extended or adjusted under 35 U.S.C. 154(b) by 442 days.

(21) Appl. No.: 13/455,466

(22) Filed: Apr. 25, 2012

(65) Prior Publication Data

US 2013/0285623 A1 Oct. 31, 2013

(51) Int. Cl.
| | |
|---|---|
| G06Q 10/06 | (2012.01) |
| G01R 31/34 | (2006.01) |
| G05B 23/02 | (2006.01) |
| G05B 13/02 | (2006.01) |
| G05B 15/02 | (2006.01) |

(52) U.S. Cl.
CPC .......... *G06Q 10/06* (2013.01); *G01R 31/343* (2013.01); *G05B 13/02* (2013.01); *G05B 15/02* (2013.01); *G05B 23/02* (2013.01)

(58) Field of Classification Search
CPC .... G05B 13/02; G05B 15/02; G05B 23/0216; G05B 2219/2642; G06Q 10/06; G06F 1/266; G01R 22/063; G01R 31/343; Y10T 307/344; Y10T 307/615; Y10T 307/62; Y10T 307/647; Y10T 307/664; Y10T 307/68

See application file for complete search history.

(56) References Cited

U.S. PATENT DOCUMENTS

| | | | |
|---|---|---|---|
| 2,748,759 | A | 6/1956 | Schiffer |
| 4,282,747 | A | 8/1981 | Holzinger |
| 4,307,690 | A | 12/1981 | Rau et al. |
| 4,421,075 | A | 12/1983 | Mandel |
| 4,423,336 | A | 12/1983 | Iverson et al. |
| 4,878,465 | A | 11/1989 | Hanson et al. |

(Continued)

FOREIGN PATENT DOCUMENTS

| | | |
|---|---|---|
| CN | 101902194 | 12/2010 |
| JP | 2011-035952 A | 2/2011 |

OTHER PUBLICATIONS

Loehlein, Timothy A., "Maintenance is one key to diesel generator set reliability", 2007, pp. 1-4.*

(Continued)

*Primary Examiner* — Crystal J Barnes-Bullock
(74) *Attorney, Agent, or Firm* — Schwegman Lundberg & Woessner, P.A.

(57) ABSTRACT

Some embodiments relate to an example system for adjusting an exercise schedule of a generator. The system includes the generator and a controller that exercises the generator according to the exercise schedule. The controller modifies the exercise schedule based on generator use. In some of the example embodiments described herein, the controller is a generator controller. Other embodiments relate to a method for adjusting an exercise schedule of a generator. The method includes exercising the generator according to the exercise schedule, and modifying the exercise schedule based on generator use.

28 Claims, 2 Drawing Sheets

(56) References Cited

U.S. PATENT DOCUMENTS

| | | | |
|---|---|---|---|
| 4,883,034 | A | 11/1989 | Yashiki et al. |
| 4,951,627 | A | 8/1990 | Watanabe et al. |
| 5,072,703 | A | 12/1991 | Sutton |
| 5,256,959 | A | 10/1993 | Nagano et al. |
| 5,320,077 | A | 6/1994 | Kamiya et al. |
| 5,504,417 | A | 4/1996 | Kern et al. |
| 5,539,258 | A | 7/1996 | Sutton et al. |
| 5,703,410 | A | 12/1997 | Maekawa |
| 5,712,786 | A | 1/1998 | Ueda |
| 5,784,878 | A | 7/1998 | Kato et al. |
| 5,973,481 | A | 10/1999 | Thompson et al. |
| 5,998,880 | A | 12/1999 | Kumar |
| 6,172,432 | B1 | 1/2001 | Schnackenberg et al. |
| 6,198,256 | B1 | 3/2001 | Miyazaki et al. |
| 6,578,548 | B2 | 6/2003 | Kohn et al. |
| 6,585,938 | B1 | 7/2003 | Machida et al. |
| 6,624,528 | B2 | 9/2003 | Shimizu et al. |
| 6,657,416 | B2 | 12/2003 | Kern et al. |
| 6,707,169 | B2 | 3/2004 | Shimizu et al. |
| 6,740,986 | B2 | 5/2004 | Shimizu et al. |
| 6,791,208 | B2 | 9/2004 | Pfeiffer |
| 6,840,203 | B2 | 1/2005 | Wakitani et al. |
| 6,853,954 | B2 | 2/2005 | Apostolides |
| 6,930,469 | B2 | 8/2005 | Krieger et al. |
| 7,165,530 | B2 | 1/2007 | Jensen et al. |
| 7,230,345 | B2 | 6/2007 | Winnie et al. |
| 7,240,481 | B2 | 7/2007 | Ament |
| 7,646,178 | B1 | 1/2010 | Fradella |
| 8,868,378 | B2 * | 10/2014 | Batzler .............. G05B 23/0216 702/188 |
| 8,965,734 | B2 | 2/2015 | Albsmeier et al. |
| 9,109,565 | B2 | 8/2015 | White et al. |
| 9,397,598 | B2 | 7/2016 | White et al. |
| 2001/0049579 | A1 | 12/2001 | Fujino et al. |
| 2002/0026417 | A1* | 2/2002 | Murata ................ G06Q 20/102 705/40 |
| 2005/0278075 | A1* | 12/2005 | Rasmussen ................ H02J 9/06 700/286 |
| 2006/0152189 | A1 | 7/2006 | Ambrosio et al. |
| 2006/0152198 | A1* | 7/2006 | Winnie ................... F02D 29/06 322/29 |
| 2009/0240377 | A1* | 9/2009 | Batzler et al. ................. 700/287 |
| 2009/0287739 | A1* | 11/2009 | Zhang et al. .............. 707/104.1 |
| 2010/0038966 | A1* | 2/2010 | Espeut, Jr. ................ H02J 3/14 307/68 |
| 2011/0153033 | A1* | 6/2011 | Walter ................... G05B 15/02 700/16 |
| 2011/0172966 | A1 | 7/2011 | Albsmeier et al. |
| 2011/0238358 | A1* | 9/2011 | Block ................... F01K 13/003 702/113 |
| 2012/0001597 | A1 | 1/2012 | Gokan et al. |
| 2012/0053884 | A1* | 3/2012 | Batzler ..................... H02J 9/08 702/122 |
| 2012/0083927 | A1 | 4/2012 | Nakamura et al. |
| 2012/0150381 | A1* | 6/2012 | Nath ....................... G07C 5/085 701/29.4 |
| 2013/0158726 | A1* | 6/2013 | Mauk ...................... G06F 1/266 700/286 |
| 2014/0197644 | A1 | 7/2014 | White et al. |
| 2015/0008740 | A1* | 1/2015 | Batzler .............. G05B 23/0216 307/23 |
| 2015/0326159 | A1 | 11/2015 | White et al. |

OTHER PUBLICATIONS

NFOA 110 "Standard for Emergency and Standby Power Systems" 2005.*

"European Application Serial No. 13001988.8, European Search Report mailed Aug. 12, 2013", 5 pgs.

"Diagnostic Repair Manual: Prepackaged Home Standby Generators", Manual Part No. 83045, Generac Power Systems, Inc. aka Generac Corporation, Waukesha, Wisconsin [downloaded Jan. 22, 2013 at http://www.zabatt.com/generators/productmanuals/083045.pdf], (Sep. 20, 1994), 230 pgs.

"Installation and Owner's Manual: Air-cooled, Prepackaged Automatic Standby Generators", Generac Power Systems, Whitewater, Wisconsin; downloaded from www.Manualslib.com, (Apr. 3, 2002), 44 pgs.

"Joint Departments of the Army and the Navy TM 5-685/NAVFAC MO-912, Operation Maintenance and Repair of Auxillary Generators, Aug. 26, 1996", (Aug. 26, 1996), 123 pgs.

"NFPA110: Standard for Emergency and Standby Power Systems (2013 Edition)", National Fire Protection Association, Quincy, Massachusetts, (Aug. 2012), 45 pgs.

"Operations Guide LI111: Electro GenConnect(TM) Automatic Start", Electro Industries, Inc., Monticello, Minnesota; www.electromn.com, (Jul. 19, 2000), 12 pgs.

"Operator's Manual 960-0153C: PowerCommand Control Generator Sets", Operator's Manual; Cummins Onan Corporation, (2000), 56 pgs.

"Owner's Manual A7218: Generac Sound Attenuated Emergency Power Systems", Generac Power Systems, Inc., (Nov. 11, 1998), 40 pgs.

"PER: Precise Engine Repair—Air Cooled Generators", Copyright 1999-2012 Precise Engine Repair, Inc., downloaded http://www.perr.com/gen.html on Jan. 21, 2013, (1999), 5 pgs.

"Product Brochure LEXX0522-03: CTS Series Automatic Transfer Switch", Caterpillar, Engine Division, (May 2003), 12 pgs.

"Product Manual: RV Generator Handbook", Cummins Onan, Minneapolis, Minnesota, (Aug. 2007), 37 pgs.

"Sales Bulletin V100: BeK2-K3 (3-phase A.M.F/A.T.S. controller/Generator controller and monitoring system", Bernini Design srl, (Jun. 2009), 8 pgs.

"Specification Sheet 1534c: Residential standby system (RS12000)", Cummins Onan, Cummins Power Generation, Minneapolis, Minnesota, (Jun. 2009), 5 pgs.

"Specification Sheet LEHF0010-00: Olympian G25LTA: Liquid Cooled Gas Engine Generator Sets", Copyright 2009 Caterpillar; www.CAT-ElectricPower.com, (Apr. 2009), 4 pgs.

"Specification Sheet LEHF0017-00: Olympian G70LG Liquid Cooled Gas Engine Generator Sets", Copyright 2009 Caterpillar; www.CAT-ElectricPower.com, (Apr. 2009), 4 pgs.

"Specification Sheet: LoadTec Permanent Pad-Mounted 250-5000KW Model OSM and OSL Series", LoadTec Load Technology Inc., Las Vegas, Nevada, (2006), 12 pgs.

"Specification Sheet: GEN-XFER Generator Set Controllers", Crompton Instruments, Mississauga, Ontario, Canada [viewed at http://www.crompton-canadaeast.com/Generator%20Set%20Solutions/pdf/xfer.pdf on Jan. 1, 2013], 4 pgs.

"Specification Sheet: Genset Controls—PowerCommand Digital Generator Set Control", Cummins Power Generation, Minneapolis, Minnesota, (2001), 9 pgs.

Loehlein, Timothy A., "Maintenance is one key to diesel generator set reliability", Power Topic 7004; Technical Information from Cummins Power Generation; White Paper by Cummins Power Generation, (2007), 4 pgs.

"European Application Serial No. 13001988.8, Response filed Apr. 24, 2014 to European Search Report mailed Aug. 12, 2013", 11 pgs.

"Chinese Application Serial No. 201310130540.7, Office Action mailed Mar. 23, 2015", (w/ English Summary), 12 pgs.

"U.S. Appl. No. 14/804,056, Non Final Office Action mailed Jan. 15, 2016", 8 pgs.

"U.S. Appl. No. 14/804,056, Response filed Dec. 3, 2015 to Non Final Office Action mailed Sep. 3, 2015", 6 pgs.

"Chinese Application No. 201310130540.7, First Office Action dated Mar. 23, 2015", (Mar. 23, 2015), 12 pgs.

"Chinese Application No. 201310130540.7, Second Office Action dated Nov. 30, 2015", (Nov. 30, 2015), 10 pgs.

"U.S. Appl. No. 14/804,056, Non Final Office Action mailed Sep. 3, 2015", 5 pgs.

"U.S. Appl. No. 14/804,056, Notice of Allowance mailed Mar. 28, 2016", 7 pgs.

"U.S. Appl. No. 14/804,056, Response filed Mar. 14, 2016 to Non Final Office Action mailed Jan. 15, 2016", 7 pgs.

(56) References Cited

OTHER PUBLICATIONS

"Chinese Application Serial No. 201310130540.7, Office Action mailed Jun. 6, 2016", w/ English Translation, (Jun. 6, 2016), 13 pgs.
"European Application Serial No. 13001988.8, Communication Pursuant to Article 94(3) EPC mailed Mar. 21, 2016", 4 pgs.
"U.S. Appl. No. 13/739,374, Non Final Office Action mailed Mar. 5, 2015", 11 pgs.
"U.S. Appl. No. 13/739,374, Notice of Allowance mailed May 5, 2015", 10 pgs.
"U.S. Appl. No. 13/739,374, Response filed Mar. 18, 2015 to Non Final Office Action mailed Mar. 5, 2015", 11 pgs.

* cited by examiner

SYSTEM AND METHOD FOR ADJUSTING THE EXERCISE SCHEDULE OF A GENERATOR

TECHNICAL FIELD

Embodiments pertain to a exercising a generator, and more particularly to a system and method for adjusting the exercise schedule of a generator.

BACKGROUND

Generators are often used to provide power when primary power sources are unable to meet demand. There are many times applications where such generators do not need to operate for extended periods of time.

In situations where a generator does not typically operate for extended periods of time, a control for the generator typically operates the generator according to an exercise schedule. This exercise schedule usually includes operating the generator according to a fixed schedule (e.g., one a week, one a month, etc.)

One of the drawbacks with exercising generators according to a fixed schedule is that a scheduled exercise may take place some period of time before and/or after normal operation of the generator. This unnecessary exercise results in (i) wasted fuel; (ii) unnecessary noise generation; and (iii) unwanted wear and tear on the generator's mechanical components. In addition, exercising generators according to a fixed schedule does not take into consideration any external factors that may affect operation of the generator.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
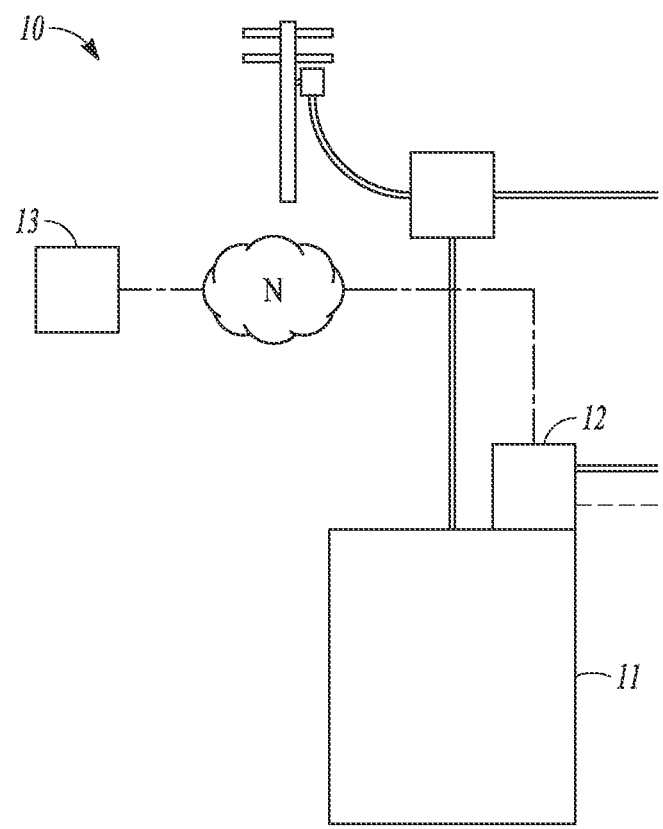
FIG. 1 is a schematic view of an example system for adjusting an exercise schedule of a generator.

FIG. 1 is a schematic view of an example system 10 for adjusting an exercise schedule of a generator 11. The system 10 includes the generator 11 and a controller 12 that exercises the generator 11 according to the exercise schedule. The controller 12 modifies the exercise schedule based on generator 11 use. In the example embodiment that is illustrated in FIG. 1, the controller 12 is a generator controller 12 (although other types of controllers are contemplated).

The generator controller 12 may change the exercise schedule based on generator 11 use. As an example, the exercise schedule may be changed from one day of the week to another day of the week.

In addition, the generator controller 12 may skip a scheduled exercise based on generator 11 use. As an example, if an exercise is scheduled for the day after the generator 11 was operated, the originally scheduled exercise may be skipped.

Embodiments are also contemplated where the parameters that are associated with the changing the exercise schedule and/or skipping a scheduled exercise may be adjusted. As an example, an exercise may be scheduled for different periods of time after generator use (e.g., 1 day, 1 week or 1 month).

In some embodiments, the generator 11 includes an engine and an alternator that is driven by the engine. In these types of embodiments, the generator controller 12 may modify the exercise schedule of the generator 11 based on engine temperature. As examples, the engine temperature may be based on coolant, oil, air, engine compartment and/or component temperature.

Embodiments are also contemplated where the generator controller 12 modifies the exercise schedule of the generator 11 based on a duration of the generator 11 use. As an example, an exercise may be scheduled farther out in the future the longer the generator is used.

It should be noted that the generator controller 12 may also modify the exercise schedule of the generator 11 based on an age of the generator 11. As an example, the older the generator 11 is, the more frequently (or less frequently) the generator 11 will be exercised. In addition, an older generator may be exercised for a shorter period of time.

It should be noted that the generator controller 12 may modify the exercise schedule of the generator 11 based on projected future generator 11 use. As an example, the generator controller 12 may skip a scheduled exercise based on the projected future generator 11 use, and then schedule an exercise if the projected future generator 11 use does not occur.

In the example embodiment that is illustrated in FIG. 1, the system 10 may further include a server 13 that is connected to generator controller 12 via a network N (e.g., the Internet). The generator controller 12 and the server 13 may exchange data such that at least one (or both) of the server 13 and the generator controller 12 modify the exercise schedule of the generator 11. It should be noted that at least one of the generator controller 12 or the server 13 may perform diagnostics on the generator 11 such that the generator controller 12 and/or the server 13 may modify the exercise schedule based on the diagnostics.

Embodiments are also contemplated where the controller 12 modifies the exercise schedule based on an external condition. In some embodiments, the generator controller 12 may modify the exercise schedule of the generator 11 based on ambient temperature. As an example, the time of the exercise may be shortened when the ambient is relatively high. As another example, an exercise may be scheduled when the ambient temperature is below a certain level.

In the example embodiment that is illustrated in FIG. 1, the generator controller 12 modifies the exercise schedule of the generator 11 based on ambient noise and/or light. As an example, the controller 11 may schedule an exercise when the ambient noise is above a certain level. As another example, the controller 11 may skip an exercise when the ambient light is below a certain level (i.e., when it is dark). Embodiments are also contemplated where the generator controller skips a scheduled exercise when hazardous materials are present in the environment where the generator 11 is located.

In some embodiments, the controller 12 may modify the exercise schedule based on selective operation of the generator 11 (e.g., a user operates the generator for some reason). In addition, the controller 12 may modify the exercise schedule based on a user selectively skipping a schedule exercise (e.g., the owner does not want a scheduled exercise to run at an inappropriate time). As an example, the "user" may be the server 13 that is connected to the generator controller 12, where the server 13 could be connected to any type of system that could provide a command to skip a scheduled exercise for whatever reason.

Figure 2:
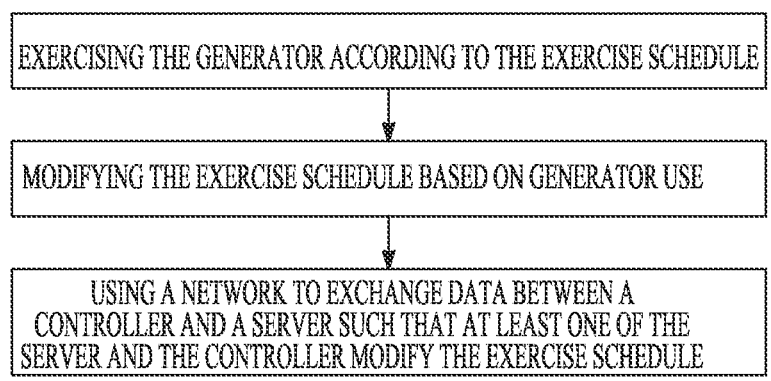
FIG. 2 is a flow diagram of an example method for adjusting an exercise schedule of a generator.

FIG. 2 is a flow diagram of an example method 20 for adjusting an exercise schedule of a generator 11. The method 20 includes [21] exercising the generator 11 according to the exercise schedule and [22] modifying the exercise schedule of the generator 11 based on generator 11 use.

In some embodiments, [22] modifying the exercise schedule based on generator 11 use may include changing the exercise schedule of the generator 11 based on generator use. In addition (or alternatively), [22] modifying the exercise schedule of the generator 11 based on generator 11 use may include skipping a scheduled exercise based on generator 11 use.

Embodiments are also contemplated where [22] modifying the exercise schedule of the generator 11 based on generator 11 use includes modifying the exercise schedule of the generator 11 based on engine temperature (e.g., when the generator includes an engine that drives an alternator.

In addition, [22] modifying the exercise schedule of the generator 11 based on generator 11 use may include (i) modifying the exercise schedule of the generator 11 based on a duration of the generator 11 use; and/or (ii) modifying the exercise schedule of the generator 11 based on an age of the generator 11.

In some embodiments, [22] modifying the exercise schedule of the generator 11 based on generator 11 use includes modifying the exercise schedule of the generator 11 based on projected future generator 11 use. As an example, modifying the exercise schedule of the generator 11 based on projected future generator 11 use may include skipping a scheduled exercise based on the projected future generator 11 use and scheduling an exercise of the generator 11 if the projected future generator 11 use does not occur.

In the example embodiment that is illustrated in FIGS. 1 and 2, the method 20 may further include [23] using a network N to exchange data between the generator controller 12 and a server 13 such that at least one of the server 13 or the generator controller 12 modifies the exercise schedule of the generator 11.

It should be noted that modifying the exercise schedule based on generator 11 use may include scheduling a duration of exercises in the modified exercise schedule. As example, exercises may be scheduled with a shorter duration for older generators and/or when there is high ambient temperature.

In alternative embodiments, [22] modifying the exercise schedule based on generator 11 use may instead include modifying the exercise schedule of the generator 11 based on an external condition. It should be noted that [22] modifying the exercise schedule of the generator 11 based on an external condition may include modifying the exercise schedule of the generator 11 based on (i) the ambient temperature, noise and light where the generator 11 is located; (ii) selective operation of the generator 11; and/or (iii) selectively skipping a schedule exercise.

The example systems 10 and methods 20 described herein may (i) conserve fuel; (ii) avoid unnecessary noise generation; and/or (iii) prevent unwanted wear and tear on the mechanical components of the generator 11. In addition, the modified exercise schedules may take into consideration external factors that could affect operation of the generator 11.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A system for adjusting an exercise schedule of a generator, the system comprising:
   a generator;
   a controller that exercises the generator according to the exercise schedule at regular intervals at predetermined times, wherein the controller modifies the exercise schedule to exercise the generator at the same regular intervals at different predetermined times based on generator use, wherein the controller modifies the exercise schedule based on a duration of generator use, wherein the exercises in the exercise schedule is scheduled further out in the future the longer the generator is used.

2. The system of claim 1, wherein the controller modifies the exercise schedule based on engine temperature.

3. The system of claim 1, wherein the controller modifies the exercise schedule based on an age of the generator.

4. The system of claim 1, wherein the controller modifies the exercise schedule based on projected future generator use.

5. The system of claim 4, wherein the controller skips a scheduled exercise based on the projected future generator use, and schedules an exercise when the projected future generator use does not occur.

6. The system of claim 1, further comprising a server that is connected to controller via a network, wherein the controller and the server exchange data such that at least one of the server and the controller modify the exercise schedule.

7. The system of claim 1, wherein the controller is a generator controller.

8. The system of claim 1, wherein the controller schedules a duration of an exercise when the controller modifies the exercise.

9. The system of claim 1, wherein the controller modifies the exercise schedule based on ambient temperature.

10. The system of claim 1, wherein the controller modifies the exercise schedule based on ambient noise.

11. The system of claim 1, wherein the controller modifies the exercise schedule based on existence of daylight.

12. A system for adjusting an exercise schedule of a generator, the system comprising:
   a generator;
   a controller that exercises the generator according to the exercise schedule, the exercise schedule configured to exercise the generator at regular intervals at predetermined times, wherein the controller modifies the frequency of exercises in the exercise schedule based on an age of the generator or the duration of the exercises in the exercise schedule.

13. A system for adjusting an exercise schedule of a generator, the system comprising:
   a generator;
   a controller that exercises the generator according to the exercise schedule at regular intervals at predetermined times, wherein the controller modifies the exercise schedule to exercise the generator at the same regular intervals at different predetermined times when a user selectively changes a scheduled exercise, wherein the controller modifies the exercise schedule based on projected future generator use, wherein the controller skips a schedule exercise based on the projected future generator use, and schedules an exercise when the projected future generator use does not occur.

14. The system of claim 13, wherein the controller modifies the exercise schedule when a user skips a scheduled exercise.

15. A method for adjusting an exercise schedule of a generator, the method comprising:
 exercising the generator according to the exercise schedule at regular intervals at predetermined times; and
 modifying the exercise schedule to exercise the generator at the same regular intervals at different predetermined times based on generator use, wherein modifying the exercise schedule based on projected future generator use includes skipping a scheduled exercise based on the projected future generator use and scheduling an exercise when the projected future generator use does not occur.

16. The method of claim 15, wherein modifying the exercise schedule based on generator use includes changing the exercise schedule based on generator use.

17. The method of claim 15, wherein modifying the exercise schedule based on generator use includes skipping a scheduled exercise based on generator use.

18. The method of claim 15, wherein modifying the exercise schedule based on generator use includes modifying the exercise schedule based on engine temperature.

19. The method of claim 15, wherein modifying the exercise schedule based on generator use includes modifying the exercise schedule based on a duration of the generator use.

20. The method of claim 15, modifying the exercise schedule based on generator use includes modifying the exercise schedule based on an age of the generator.

21. The method of claim 15, wherein modifying the exercise schedule based on generator use includes modifying the exercise schedule based on projected future generator use.

22. The method of claim 15, further comprising using a network to exchange data between a controller and a server such that at least one of the server and the controller modify the exercise schedule.

23. The method of claim 22, wherein using a network to exchange data between a controller and a server includes using a network to exchange data between a generator controller and a server.

24. The method of claim 15, wherein modifying the exercise schedule based on generator use includes scheduling a duration of exercises in the modified exercise schedule.

25. A method for adjusting fixed exercise schedule of a generator, the method comprising:
 exercising the generator according to the fixed exercise schedule at regular intervals at predetermined times; and
 modifying the fixed exercise schedule to exercise the generator at the same regular intervals at different predetermined times based on hazardous materials being present in an environment where the generator is located.

26. The method of claim 25, wherein modifying the fixed exercise schedule based on an external condition includes modifying the fixed exercise schedule based on ambient temperature.

27. The method of claim 25, wherein modifying the fixed exercise schedule based on an external condition includes modifying the fixed exercise schedule based on ambient noise.

28. The method of claim 25, wherein modifying the fixed exercise schedule based on an external condition includes modifying the fixed exercise schedule based on ambient light.

* * * * *